United States Patent [19]
Hsu et al.

[11] Patent Number: 5,966,329
[45] Date of Patent: Oct. 12, 1999

[54] APPARATUS AND METHOD FOR PROGRAMMING PMOS MEMORY CELLS

[75] Inventors: Ching-Hsiang Hsu, Hsinchu, Taiwan; Shang-De Ted Chang, Fremont; Nader Radjy, Palo Alto, both of Calif.

[73] Assignee: Programmable Microelectronics Corporation, San Jose, Calif.

[21] Appl. No.: 08/948,147

[22] Filed: Oct. 9, 1997

[51] Int. Cl.[6] ................................................. G11C 16/04
[52] U.S. Cl. .............................. 365/185.18; 365/185.19; 365/185.24
[58] Field of Search .................... 365/185.18, 185.19, 365/185.24

[56] References Cited

PUBLICATIONS

Ohnakado, T., et al., "Novel Electron Injection Method Using Band–to–Band Tunneling Induced Hot Electron (BBHE) for Flash Memory with a P–Channel Cell", *IEEE* pp. 279–282 (1995).

*Primary Examiner*—Son T. Dinh
*Attorney, Agent, or Firm*—Flehr Hohbach Test Albritton & Herbert LLP

[57] ABSTRACT

A program voltage of a first level is applied to the control gate of a PMOS floating gate memory cell to realize an injection of hot electrons induced by band-to-band tunneling (BTBT) into the floating gate of the cell. As the threshold voltage of the cell increases due to the accumulation of charge on the floating gate, the injection of BTBT induced hot electrons subsides. The program voltage is reduced to a second level which induces the injection of channel hot electrons (CHE) into the floating gate, thereby boosting the rate of charge accumulation on the floating gate.

17 Claims, 4 Drawing Sheets

APPARATUS AND METHOD FOR PROGRAMMING PMOS MEMORY CELLS

CROSS REFERENCE TO RELATED APPLICATIONS

This application is related to the commonly-owned U.S. patent applications Ser. No. 08/948531, filed Oct. 9, 1997, now U.S. Pat. No. 5,909,392 entitled "PMOS Memory Array Having OR Gate Architecture," and Ser. No. 08/947850, filed Oct. 9, 1997, now pending entitled "Nonvolatile PMOS Two Transistor Memory Cell and Array", both filed on the same day as the present application.

BACKGROUND

1. Field of Invention

This invention relates generally to semiconductor memories and specifically to a method of programming a PMOS floating gate memory cell.

2. Description of Related Art

Conventional memories such as EEPROM and Flash EEPROM typically employ as a memory cell an N-channel floating gate transistor of the type shown in FIG. 1. The NMOS floating gate memory cell 10 is formed in a p-substrate 12 and includes an n+ source 14 and an n+ drain 16. A channel 18 extends within the substrate 12 between the n+ source 14 and the n+drain 16. A thin gate dielectric layer 20 separates a polysilicon floating gate 22 from the substrate 12. The gate dielectric 20 may be, for instance, a layer of silicon dioxide ($SiO_2$), having a thickness of approximately 100 Å. A second dielectric layer 24 separates a control gate 26 from the floating gate 22. Although not illustrated in FIG. 1, a protective insulating layer is typically formed over the cell 10, and electrical contacts are made to the n+ source 14, the n+ drain 16, and the control gate 26.

To program the cell 10, approximately 5 volts and 12 volts are applied to the drain 16 and the control gate 26, respectively, for a few milliseconds, while the source 14 is held at a low potential, e.g., ground potential. In response thereto, electrons accelerate across the channel 18 and, colliding with electrons and lattice atoms proximate the drain 16, generate hot electrons. The hot electrons are attracted to the high positive voltage on the control gate 26 and tunnel into the floating gate 22. The resulting accumulation of negative charge within the floating gate 22 increases the threshold voltage of the cell 10, thereby programming the cell 10.

The cell 10 may be erased by floating the drain 16, grounding the control gate 26, and applying approximately 12 volts to the source 14. Electrons within the floating gate 22 tunnel through the gate dielectric 20 and into the source 14, thereby restoring the threshold voltage to its original level and, thus, erasing the cell 10.

To read the cell 10, the source 14 is grounded, the drain 16 is held at between approximately 1 and 2 volts, and the control gate 26 is held at approximately 5 volts. Under these bias conditions, the cell 10 will conduct a channel current only if in an erased state.

Technological improvements have led to the development of a PMOS floating gate memory cell, as disclosed in the commonly owned and co-pending U.S. patent application Ser. No. 08/557,589 entitled "A PMOS Memory Cell with Hot Electron Injection Programming and Tunneling Erasing," filed Nov. 14, 1995, now issued as U.S. Pat. No. 5,687,118 to Chang and incorporated by reference herein. FIG. 2 illustrates a PMOS floating gate memory cell 30 of the type disclosed in the Chang patent. The cell 30 is formed in an n− well region 32 of a p− substrate 34. A p+ source 36 and a p+ drain 38 are formed in the n− well region 32. A channel region 40 extends within the n− well 32 between the p+ source 36 and the p+ drain 38. A polysilicon floating gate 42 is insulated from the n− well region 32 by a thin oxide layer 44. Preferably, the oxide layer 44 is approximately between 80–130 Å thick and extends over the entire length of the channel region 40 and portions of both the p+ source 36 and the p+ drain 38. A control gate 46 is insulated from the floating gate 42 by an insulating layer 48. In its intrinsic state, the memory cell 30 has a threshold voltage $V_T$ of between approximately −1.5 and −2.0 volts.

The cell 30 may be programmed, for instance, by applying approximately 6.5 volts to the p+ source 36, grounding the p+ drain 38, and ramping the control gate 46 from a first voltage to a second voltage. These bias conditions cause positively charged holes to accelerate across the channel 40 towards the p+ drain 38. These accelerating holes collide with electrons and lattice atoms in a drain depletion region 50 proximate the p+ drain 38, thereby resulting in impact ionization. High energy electrons generated from the impact ionization are attracted to the ramped voltage on the control gate 46 and are thereby injected into the floating gate 42. The resultant negative charge on the floating gate 42 shifts the threshold voltage $V_T$ of the cell 30 to a more positive potential, thereby programming the cell 30.

To erase the cell 30, approximately 9 volts is applied to the p+ source 36, to the p+ drain 38, and to the n− well 32, while the control gate 46 is grounded. Electrons within the floating gate 42 tunnel through the oxide layer 44 and into the p+ source 36, the p+ drain 38, and the channel 40 of the cell 30, thereby returning the threshold voltage $V_T$ of the cell 30 to its normal level. This erasing technique is known as a channel erase.

The binary state of the cell 30 is read by applying, for instance, a supply voltage $V_{CC}$ of approximately 3 volts to the p+ source 36 and to the n− well 32. The control gate 46 is coupled to a potential between ground potential and $V_{CC}$ and the p+ drain 38 is coupled to a voltage slightly less than $V_{CC}$. Under these bias conditions, the cell 30 conducts a channel current only if in a programmed state, i.e., only if the floating gate 42 is negatively charged. Thus, unlike NMOS memory cells, the PMOS memory cell 30 of FIG. 2 does not suffer from read disturb problems. The cell 30 is advantageous in numerous other ways over conventional NMOS memory cells, as discussed in the Chang patent.

However, in spite of the advantages realized by the recently developed PMOS floating gate memory cell, demand for faster programming speeds and higher endurance necessitates continual improvements in memory. Thus, it would be desirable to increase the speed with which a floating gate memory cell, e.g., cell 30, is programmed while also improving the endurance of the cell.

SUMMARY

A novel programming scheme is disclosed which increases the programming speed and performance of a PMOS floating gate memory cell. In accordance with the present invention, the accumulation of charge on the floating gate of the cell is initially realized by the injection of hot electrons induced by band-to-band tunneling (BTBT) into the floating gate of the cell. As the threshold voltage of the cell increases due to the accumulation of charge on the floating gate, the injection of BTBT induced hot electrons into the floating gate subsides. Charging of the floating gate is then boosted by inducing the injection of channel hot electrons (CHE) into the floating gate. Programming a PMOS floating gate memory cell using a combination of BTBT induced hot electron injection and CHE injection results in an unexpected increase in programming speeds.

Like components in the Figures are similarly labeled.

DETAILED DESCRIPTION

Embodiments of the present invention are discussed below in the context of programming the PMOS floating gate memory cell 30 of FIG. 2. However, it is to be understood that embodiments in accordance with the present invention are equally applicable to other types of PMOS memory cells, as well as to memory cells employed as part of any suitable memory array architecture. Thus, embodiments of the present invention should not be construed as limited to the specific examples provided herein.

As mentioned earlier, the programming speed of a floating gate memory cell is improved by using a combination of band-to-band tunneling (BTBT) induced hot electron injection and channel hot electron (CHE) injection to accumulate negative charge on the floating gate of the memory cell. In accordance with the present invention, a programming voltage $V_P$ of a first potential is applied to the cell to inject BTBT induced hot electrons into the floating gate of the cell. As the threshold voltage $V_T$ of the cell becomes more positive due to the accumulation of charge thereon, electron tunneling subsides and, thus, so does the resulting gate current $I_G$ of the cell. The program voltage $V_P$ is then reduced to approximately a second potential to induce CHE injection into the floating gate of the memory cell, thereby increasing the rate at which charge accumulates on the floating gate of the memory cell, i.e., the gate current $I_G$, and, accordingly, accelerating the programming of the cell.

Figure 1:
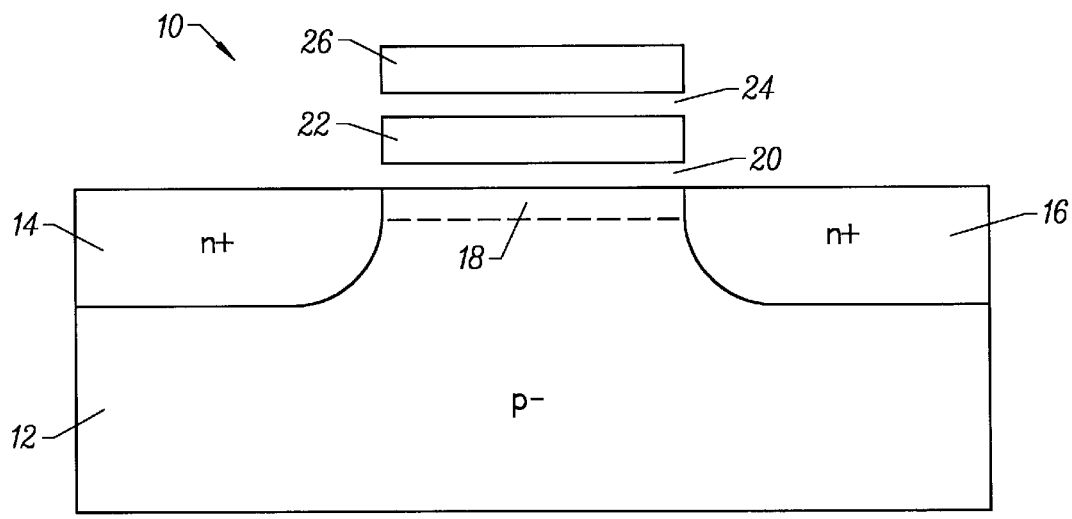
FIG. 1 is a schematic diagram of an NMOS floating gate memory cell in accordance with the prior art.
Figure 2:
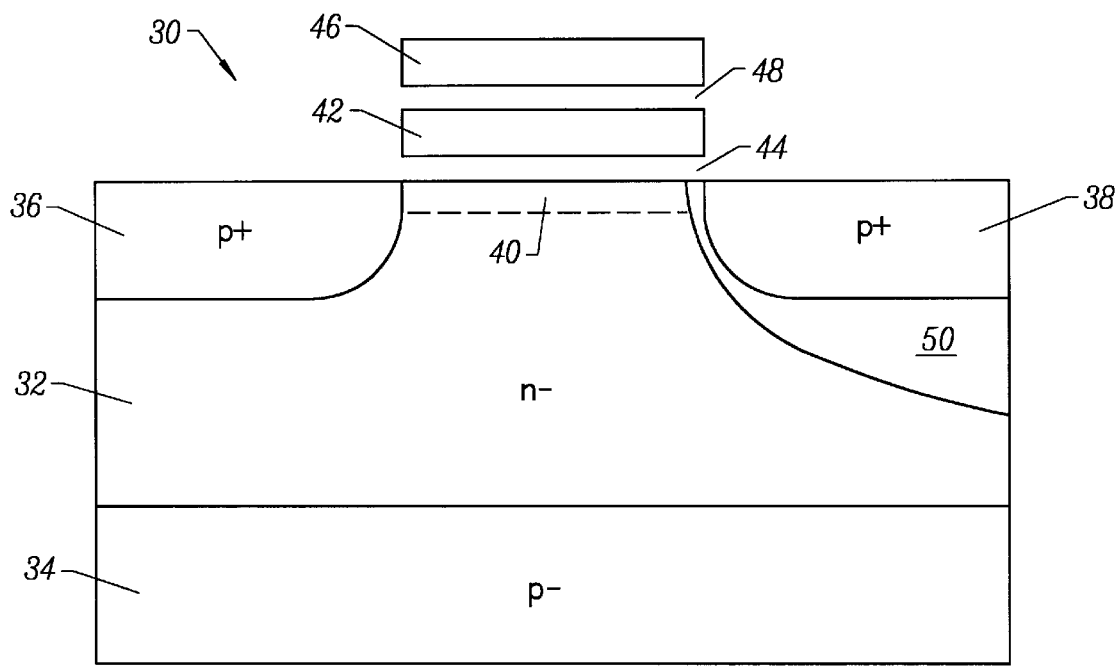
FIG. 2 is a schematic diagram of a prior art PMOS floating gate memory cell of the type disclosed in the Chang patent.

For instance, to program the PMOS floating gate memory cell 30 of FIG. 2, the p+ source 36 is held at approximately 8 volts, the p+ drain 38 is held at approximately 3 volts, and the control gate 46 is held at approximately 10 volts. Under these bias conditions, electron-hole pairs are generated by BTBT in the p+ drain 38. The electrons are accelerated by a lateral field across the channel region 40 and collide with lattice atoms near the p+ drain 38. Hot electrons generated in the resulting impact ionization are attracted to the high positive potential on the control gate 46 and are injected into the floating gate 42. The gate current $I_G$ realized by BTBT results in the accumulation of negative charge on the floating gate 42. As the floating gate 42 becomes increasingly negatively charged, the threshold voltage $V_T$ of the cell 30 becomes more positive and, as a result, the program voltage $V_P$ on the control gate 46 is increasingly less able to sustain BTBT. Thus, as the threshold voltage $V_T$ of the cell 30 becomes more positive, the gate current $I_G$ realized by BTBT subsides, thereby resulting in a corresponding decrease in the rate of charge accumulation on the floating gate 42.

Figure 3:
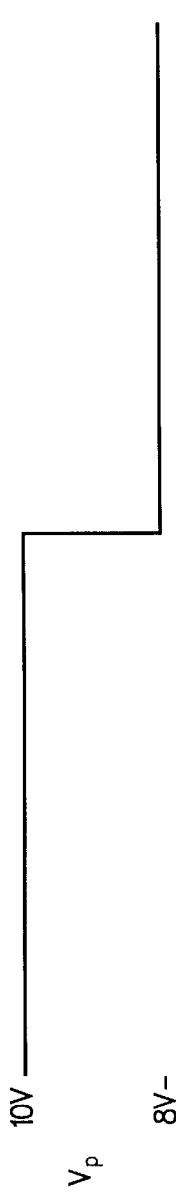
FIG. 3 is a timing diagram illustrating the programming voltage $V_P$ used to program the memory cell of FIG. 2 in accordance with one embodiment of the present invention.
Figure 4:
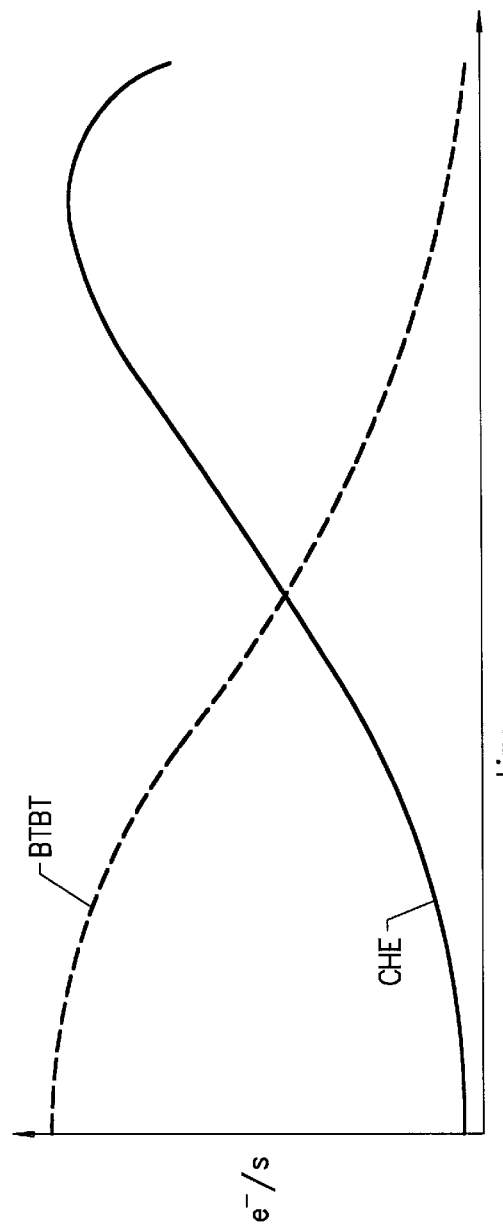
FIG. 4 is a graph illustrating the accumulation of charge on the floating gate of the memory cell of FIG. 2 realized by a combination of band-to-band tunneling (BTBT) induced electron tunneling and channel hot electron (CHE) injection, as induced in accordance with the programming voltage $V_P$ depicted in FIG. 3.

When the injection of BTBT induced hot electrons has significantly subsided, i.e., when the gate current $I_G$ decreases below a first predetermined level, corresponding to the threshold voltage $V_T$ increasing beyond a second predetermined level, the programming voltage $V_P$ applied to the control gate 46 of the cell 30 is reduced to approximately 8 volts, as illustrated in FIG. 3, to induce a rapid injection of channel hot electrons into the floating gate 42. Thus, when the program voltage $V_P$ is reduced to approximately 8 volts, holes accelerate across the channel 40 and collide with electrons and lattice atoms within the drain depletion region 50. Hot electrons generated by impact ionization are attracted to the positive voltage $V_P$ on the control gate 46 and are thereby injected into the floating gate 42 of the cell 30, as indicated in FIG. 4. As a result, the gate current $I_G$ of the cell 30 is significantly boosted which, in turn, results in a corresponding increase in the rate at which charge accumulates on the floating gate 42. In this manner, the floating gate 42 of the cell is effectively "turbo-charged" by inducing CHE injection into the floating gate 42. The program voltage $V_P$ is maintained at approximately 8 volts until programming of the cell 30 is complete. Note that while BTBT induced hot electron injection does not generate a channel current, CHE injection does.

When programming the cell 30 in accordance with the present invention, the two mechanisms employed to charge the floating gate 42, i.e., BTBT and CHE injection, are not mutually exclusive. Indeed, CHE injection commences before the program voltage $V_P$ is reduced from approximately 10 volts to approximately 8 volts and, in a complementary manner, the injection of BTBT induced hot electrons into the floating gate 42 continues, albeit at a decreasing rate, after the program voltage $V_P$ is reduced to approximately 8 volts. The overlap of these two program mechanisms is depicted in FIG. 4, where the rate of charge accumulation on the floating gate 42 resulting from BTBT induced hot electron injection is indicated by the dashed line, and the rate of charge accumulation on the floating gate 42 resulting from CHE injection is indicated by the solid line. Note that the relationship between the program voltage $V_P$ and of the gate current $I_G$ realized by each of these program mechanisms is similar to the respective relationships depicted in FIG. 4.

In one embodiment, the program voltage $V_P$ applied to the control gate 46 of the cell 30 is held at approximately 10 volts for approximately 5 $\mu$s, thereby inducing an initial gate current of approximately 10–100 nA. As the threshold voltage $V_T$ approaches between 0 and 2 volts, at which point the gate current $I_G$ of the cell 30 is less than or equal to approximately 1 pA, the program voltage $V_P$ is reduced to approximately 8 volts which, as discussed above, induces a rapid injection of CHE into the floating gate 42. In response thereto, the gate current $I_G$ of the cell 30 rapidly increases to as high as approximately 1 nA. The program voltage $V_P$ is held at approximately 8 volts for approximately between 1 and 5 μs and, in bringing the threshold voltage $V_T$ of the cell 30 to approximately 4 volts, completes programming of the cell 30.

Programming a PMOS floating gate memory cell using a combination of BTBT induced hot electron injection and CHE injection, according to the present invention, results in several advantages over conventional programming techniques. First, employing a combination of BTBT induced hot electron injection and CHE injection to charge the floating gate of a memory cell such as, for instance, the cell 30 of FIG. 2, produces an unexpected increase in programming speed. For instance, Applicants have found that charging the floating gate 42 using only BTBT requires approximately 50 μs to program the cell 30, and that charging the floating gate 42 using only CHE injection requires approximately 50 μs to program the cell 30. In contrast, using a program voltage $V_P$ to initially induce BTBT induced hot electron injection and to later induce a rapid injection of channel hot electrons, as described above, requires less than approximately 10 μs to program the cell 30.

Further, when programming a PMOS floating gate memory cell in accordance with the present invention, the gate current $I_G$ is initially induced and sustained by BTBT induced hot electron injection. Since band-to-band electron tunneling does not require a channel current, power dissipation is minimized during initial portions of the programming cycle, as compared to later portions of the programming cycle in which CHE injection is induced. This reduction in power dissipation, in turn, minimizes heat-induced stress damage to the cell 30, thereby increasing the endurance of the cell 30.

Figure 5:
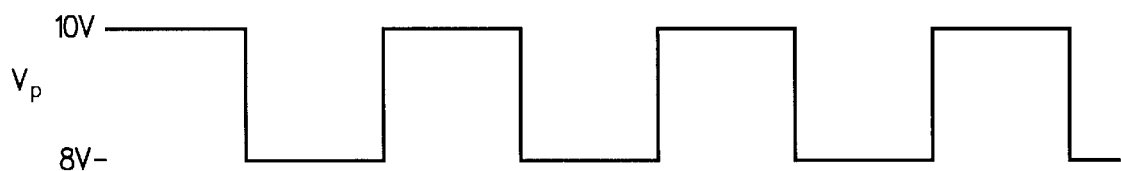
FIG. 5 is a timing diagram illustrating a clocked, square wave programming voltage $V_P$ used to program the memory cell of FIG. 2 in accordance with another embodiment of the present invention.
Figure 6:
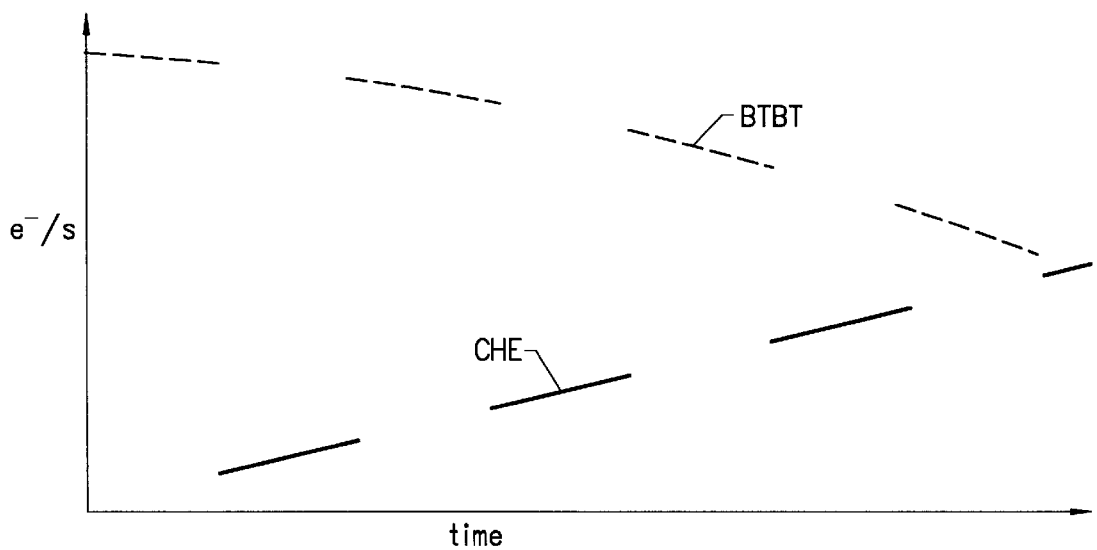
FIG. 6 is a graph illustrating the accumulation of charge on the floating gate of the memory cell of FIG. 2 realized by a combination of BTBT induced electron tunneling and CHE injection, as induced by the clocked, square wave programming voltage $V_P$ depicted in FIG. 5.

In accordance with another embodiment of the present invention, the cell 30 is programmed by successively alternating between using BTBT induced hot electron injection and CHE injection as the primary mechanism to realize a gate current $I_G$ in the cell 30. Here, a clocked, square wave programming voltage $V_P$ which, as illustrated in FIG. 5, alternates between a high of approximately 10 volts and a low of approximately 8 volts, is applied to the control gate 46 of the cell 30. During those portions of the programming cycle in which the programming voltage $V_P$ is high, the gate current $I_G$ of the cell 30 is primary realized by BTBT induced hot electron injection, as indicated by the dashed line in FIG. 6. During those portions of the programming cycle in which the programming voltage $V_P$ is low, the gate current $I_G$ of the cell 30 is primarily realized by CHE injection, as indicated by the solid line in FIG. 6.

Successively alternating between using BTBT induced hot electron injection and CHE injection as the primary mechanism to realize a gate current in the cell 30 allows for even faster programming speeds. For instance, in one embodiment, where the programming voltage $V_P$ waveform illustrated in FIG. 5 has a period of approximately 2 μs and a duty cycle of approximately 50%, the cell 30 is completely programmed in less than 10 μs. In addition, using a clocked pulsed programming waveform of the type shown in FIG. 5 allows for more accurate control over programming. For instance, when using the program voltage waveform shown in Figure, the cell 30 can be completely programmed after several clocked pulses. In contrast, where the stepped program voltage waveform shown in FIG. 3 is employed, it is more difficult to estimate the specific times during which the program voltage is at either 10 volts or 8 volts in order to obtain an optimum programming speed.

Present embodiments are equally applicable for programming a floating gate memory cell such as, for instance, the PMOS cell 30 of FIG. 2, when configured as part of a memory array. For instance, the cell 30 may be included as a storage element of an associated PMOS OR string of the type disclosed in the above-referenced U.S. Pat. Application entitled "PMOS Memory Array Having OR Gate Architecture."

Figure 7:
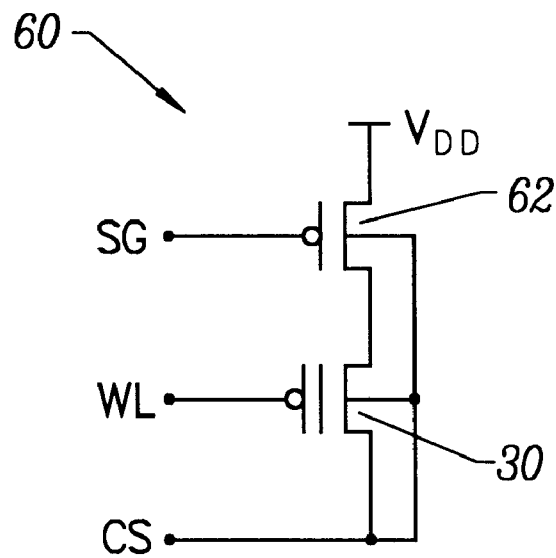
FIG. 7 is schematic diagram of a 1-bit cell of a PMOS OR string.

FIG. 7 shows a 1-bit OR string 60 of the type disclosed in that patent application as having a PMOS select transistor 62 coupled between a supply voltage $V_{DD}$ and the cell 30. The n– well region within which are formed the select transistor 62 and the cell 30, as well as the source of the cell 30, is coupled to a common source line CS. The gate of the select transistor 62 is coupled to a select gate line SG, and the control gate 46 of the cell 30 is coupled to a word line WL (see also FIG. 2). To program the cell 30 of the OR string 60, the select gate line SG is grounded, thereby allowing the supply voltage $V_{DD}$ to couple to the source of the cell 30 via the select transistor 62. The common source line CS is held at approximately 8 volts. A programming voltage $V_P$ of a type disclosed above in accordance with the present invention is coupled to the word line WL, thereby programming the cell 30 of the OR string 60 as described above.

Figure 8:
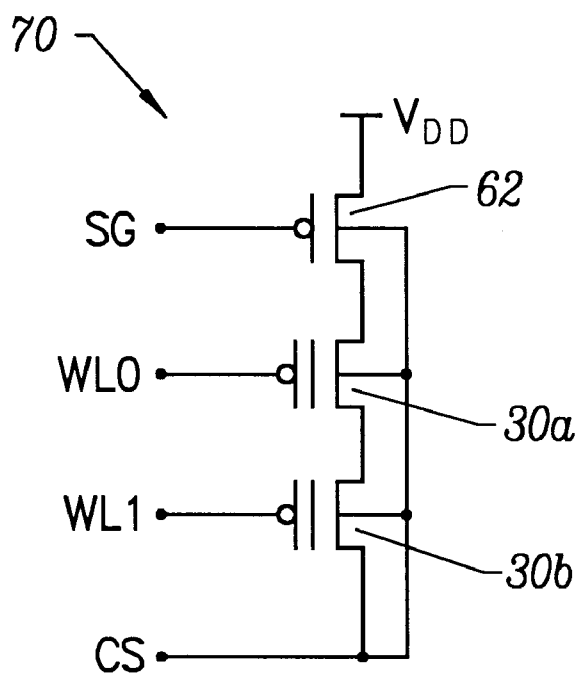
FIG. 8 is a schematic diagram of a 2-bit cell of a PMOS OR string.

FIG. 8 shows a 2-bit OR string 70 of the type disclosed in that patent application as having a PMOS select transistor 62 coupled between a supply voltage $V_{DD}$ and two series-connected cells 30a and 30b. The n-well region within which are formed the select transistor and the cells 30a and 30b, as well as the sources of the cells 30a and 30b, is coupled to a common source line CS. The gate of the select transistor 62 is coupled to a select gate line SG, and the control gates 46 of the cell 30a and 30b are coupled to word lines WL0 and WL1, respectively.

To program the cell 30a of the OR string 70, the select gate line SG and the word line WL1 are grounded, thereby turning on the select transistor 62 and the cell 30b, respectively. The common source line CS is held at approximately 8 volts. The supply voltage $V_{DD}$ is coupled to the drain of the selected cell 30a via the select transistor 62, and the approximately 8 volts on the common source line CS is coupled to the source of the selected cell 30a via the un-selected cell 30b. The programming voltage $V_P$ is applied to the selected word line WL0, thereby programming the selected cell 30a as described above.

To program the cell 30b of the OR string 70, the select gate line SG and the word line WL0 are grounded, thereby turning on the select transistor 62 and the unselected cell 30a, respectively. The common source line CS, and thus the source of the selected cell 30b, is held at approximately 8 volts. The supply voltage $V_{DD}$ is coupled to the drain of the selected cell 30b via the select transistor 62 and the un-selected cell 30a. Accordingly, application of a programming voltage $V_P$ described above to the selected word line WL1 programs the selected cell 30b in accordance with the present invention.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. Specifically, the bias conditions disclosed above in connection with programming techniques of the present invention may vary, depending upon desired operating characteristics and device parameters, as would be understood by one skilled in the art.

We claim:

1. A method of programming a PMOS floating gate memory cell having a p+ source, a p+ drain, a floating gate, and a control gate, said method comprising the steps of:

injecting into said floating gate hot electrons induced predominantly by band-to-band tunneling until a predetermined event occurs; and after said predetermined event occurs, predominantly inducing injection of channel hot electrons into said floating gate.

2. The method of claim 1, wherein said predetermined event comprises a threshold voltage of said memory cell reaching a predetermined level.

3. The method of claim 2, wherein said predetermined level is between approximately 0 and 2 volts.

4. The method of claim 1, wherein said predetermined event comprises a gate current of said memory cell decreasing below a predetermined level.

5. The method of claim 4, wherein said predetermined level is approximately 1 pA.

6. The method of claim 1, wherein the band-to-band tunneling of electrons is induced by applying a first voltage to said p+ source, a second voltage to said p+ drain, and approximately 10 volts to said control gate.

7. The method of claim 1, wherein the injection of channel hot electrons into said floating gate is induced by applying a first voltage to said p+ source, a second voltage to said p+ drain, and approximately 8 volts to said control gate.

8. The method of either claim 6 or 7, wherein said first voltage is approximately 8 volts and said second voltage is approximately 3 volts.

9. The method of claim 1, wherein when said predetermined event occurs, a program voltage applied to said control gate is reduced from approximately 10 volts to approximately 8 volts.

10. A method of programming a floating gate memory cell by using a programming voltage to successively alternate between (1) predominantly injecting hot electrons induced by a band-to-band tunneling into said floating gate and (2) predominantly injecting channel hot electrons into said floating gate.

11. The method of claim 10, wherein a clock signal alternating between a first potential associated with the first injecting step and a second potential associated with the second injecting step is coupled to said control gate to facilitate programming of said memory cell.

12. The method claim 11, wherein said first potential is approximately 10 volts and said second potential is approximately 8 volts.

13. The method of claim 11, wherein said clock signal has a period associated therewith of approximately 1–2 $\mu$s.

14. The method of claim 11, wherein a first portion of a period of said clock signal, during which said control gate is at said first potential, is greater than a second portion of said period of said clock signal, during which said control gate is at said second potential.

15. The method of claim 11, wherein a first portion of a period of said clock signal, during which said control gate is at said first potential, is less than a second portion of said period of said clock signal, during which said control gate is at said second potential.

16. The method of claim 11, wherein said clock signal has a period associated therewith, said period increasing as function of time.

17. The method of claim 11, wherein said clock signal has a period associated therewith, said period decreasing as function of time.

* * * * *